(12) United States Patent
Roy et al.

(10) Patent No.: US 9,337,067 B2
(45) Date of Patent: May 10, 2016

(54) HIGH TEMPERATURE ELECTROSTATIC CHUCK WITH RADIAL THERMAL CHOKES

(75) Inventors: Shambhu N. Roy, Sunnyvale, CA (US); Vincent E. Burkhart, Cupertino, CA (US); Scott J. Fields, Hollister, CA (US)

(73) Assignee: Novellus Systems, Inc., Fremont, CA (US)

( * ) Notice: Subject to any disclaimer, the term of this patent is extended or adjusted under 35 U.S.C. 154(b) by 1020 days.

(21) Appl. No.: 13/467,861

(22) Filed: May 9, 2012

(65) Prior Publication Data
US 2012/0285658 A1 Nov. 15, 2012

Related U.S. Application Data

(60) Provisional application No. 61/486,113, filed on May 13, 2011.

(51) Int. Cl.
| | |
|---|---|
| *H01L 21/683* | (2006.01) |
| *H01L 21/687* | (2006.01) |
| *H01L 21/67* | (2006.01) |

(52) U.S. Cl.
CPC ...... *H01L 21/67109* (2013.01); *H01L 21/6831* (2013.01); *H01L 21/68785* (2013.01); *H01L 2924/0002* (2013.01)

(58) Field of Classification Search
CPC ........... H01L 21/6831; H01L 21/6833; H01L 21/67103; H01L 21/67109; H01L 21/68785; H01L 2924/00; H01L 2924/0002
USPC ........................................................ 279/128
See application file for complete search history.

(56) References Cited

U.S. PATENT DOCUMENTS

| | | | | |
|---|---|---|---|---|
| 5,841,624 | A * | 11/1998 | Xu et al. ....................... | 361/234 |
| 6,081,414 | A | 6/2000 | Flanigan et al. | |
| 6,219,219 | B1 * | 4/2001 | Hausmann et al. .......... | 361/234 |
| 6,291,777 | B1 * | 9/2001 | Burkhart et al. ............. | 174/262 |
| 6,669,783 | B2 | 12/2003 | Sexton et al. | |
| 6,853,533 | B2 * | 2/2005 | Parkhe ......................... | 361/234 |
| 7,907,384 | B2 | 3/2011 | Brown et al. | |
| 8,390,980 | B2 * | 3/2013 | Sansoni et al. .............. | 361/234 |
| 2002/0129475 | A1 * | 9/2002 | Tsai et al. ..................... | 29/25.01 |
| 2006/0237138 | A1 | 10/2006 | Qin | |
| 2007/0020937 | A1 * | 1/2007 | Chen et al. .................... | 438/689 |

(Continued)

FOREIGN PATENT DOCUMENTS

| | | |
|---|---|---|
| WO | 2007131057 | 11/2007 |
| WO | WO 2012/158528 | 11/2012 |

OTHER PUBLICATIONS

International Search Report and Written Opinion mailed Jan. 31, 2013 in PCT application No. PCT/US2012/037543.

(Continued)

*Primary Examiner* — Tho V Duong
(74) *Attorney, Agent, or Firm* — Weaver Austin Villeneuve & Sampson LLP

(57) ABSTRACT

A wafer support assembly including a wafer support and cooling plate with radial thermal chokes is provided. The cooling plate and wafer support may have limited contact and may not contact each other outside of certain limited thermal contact patches. The thermal contact patches may generally define one or more radial thermal choke regions. In some implementations, high- and low-temperature cooling systems may be placed at one or more locations across the cooling plate to assist in temperature management.

38 Claims, 11 Drawing Sheets

(56) References Cited

U.S. PATENT DOCUMENTS

| | | |
|---|---|---|
| 2008/0138535 A1* | 6/2008 | Hwang .................. 427/569 |
| 2010/0039747 A1 | 2/2010 | Sansoni et al. |
| 2011/0272899 A1* | 11/2011 | Shimazu .................. 279/128 |
| 2014/0177123 A1 | 6/2014 | Thach et al. |
| 2015/0129165 A1 | 5/2015 | Parkhe et al. |

OTHER PUBLICATIONS

U.S. Appl. No. 14/875,473, filed Oct. 5, 2015, entitled "Electrostatic Chuck With Thermal Choke".

PCT International Report on Patentability and Written Opinion dated Nov. 28, 2013 issued in PCT/US2012/037543.

* cited by examiner

HIGH TEMPERATURE ELECTROSTATIC CHUCK WITH RADIAL THERMAL CHOKES

CROSS-REFERENCE TO RELATED APPLICATIONS

This application claims benefit under 35 U.S.C. §119(e) to U.S. Provisional Application No. 61/486,113, filed May 13, 2011, which is incorporated by reference herein in its entirety.

BACKGROUND OF THE INVENTION

Semiconductor wafers are often held in place during various semiconductor wafer processing steps using an electrostatic chuck (ESC).

ESCs may incorporate electrodes used to generate electromagnetic fields via radio frequency (RF). An ESC may also include a heater to heat a wafer prior to or during processing. Additional heat may be added to a wafer or ESC during processing due to the process environment.

SUMMARY OF THE INVENTION

Methods, apparatus, and systems for improving thermal uniformity across a wafer support are provided. According to various implementations, the methods, apparatuses, or systems may involve the implementation of one or more radial thermal chokes in the heat flow path from the wafer support to, for example, a pedestal. The methods, apparatuses, or systems may also involve the implementation of high-temperature coolers in conjunction with the radial thermal chokes.

In some implementations, a wafer support assembly for use in semiconductor processing may be provided. The wafer support assembly may include a substrate support that is substantially cylindrical and has a nominal outer diameter D. The substrate support may include a top side configured to support a semiconductor wafer, and a bottom side opposite the top side. The wafer support assembly may also include a cooling plate that is substantially radially symmetric. The cooling plate may contact the bottom side of the substrate support across a first thermal contact patch with a first area. The first thermal contact patch may be substantially annular in shape, centered on the substrate support, and have a nominal inner diameter and a nominal outer diameter defining an average nominal diameter of between 50% to 70% of D. The cooling plate and the substrate support may have substantially no contact with each other outside of the nominal outer diameter of the first thermal contact area, and the cooling plate may include a first radial thermal choke in a region outside of the nominal outer diameter of the first thermal contact area.

In some further implementations, the cooling plate may also contact the bottom side of the substrate support across a second thermal contact patch with a second area. The second thermal contact patch may be substantially circular in overall exterior shape, centered on the substrate support, and have a nominal outer diameter less than 20% of D. The cooling plate may further include a second radial thermal choke in a region between the nominal outer diameter of the second thermal contact patch and the nominal inner diameter of the first thermal contact patch.

In some implementations, the substrate support and the cooling plate may be bonded together across the second thermal contact patch and the cooling plate may contact the substrate support in the second thermal contact patch at least partially via the bond material.

In some implementations, the substrate support and the cooling plate may have a through-hole extending through the center of both the substrate support and the cooling plate. In some further implementations, the substrate support and the cooling plate may have substantially no contact with each other between the nominal inner diameter of the first thermal contact patch and the nominal outer diameter of the second thermal contact patch.

In some implementations, the cooling plate may have one or more feed-through holes between the nominal inner diameter of the first thermal contact patch and the nominal outer diameter of the second thermal contact patch, each feed-through hole aligned with a corresponding feature in the substrate support and each sized such that a component associated with the feed-through hole does not contact the cooling plate when installed in the wafer support assembly. In some further implementations, the cooling plate may include a threaded hole pattern between the one or more feed-through holes and the through-hole, the threaded hole pattern configured to mount a gas feed line interface.

In some implementations, the wafer support may be made from a ceramic and/or the cooling plate may be made from molybdenum. In some implementations, the wafer support may include one or more planar electrodes embedded and/or a heater element embedded within the substrate support.

In some implementations, the wafer support assembly may further include a pedestal base. The pedestal base may have an annular overall shape and a raised annular rim having an inner rim diameter smaller than an outer diameter of the cooling plate. The pedestal base may also have an inner region recessed from, and bounded by, the raised annular rim. The cooling plate may be in contact with the raised annular rim, and the inner region may be separated from the cooling plate by a gap. The cooling plate may be mounted to the pedestal base via a mounting interface on the raised annular rim, and the cooling plate may be substantially centered on the raised annular rim.

In some implementations, the wafer support assembly may further include a cooling plate seal. The pedestal base, the cooling plate, or both the pedestal base and the cooling plate may also include features configured to receive the cooling plate seal. The cooling plate seal may hermetically seal the mounting interface.

In some implementations, the pedestal base may include one or more cooling passages in thermal contact with the pedestal base and configured to route cooling fluid flow across a distributed area of the pedestal base. In some implementations, the one or more cooling passages may be located within the inner region.

In some implementations with a pedestal base, the pedestal base may further include an annular cavity outside of the inner region, the annular cavity containing one or more electromagnetic coils. The pedestal base may be made from aluminum.

In some implementations, the wafer support assembly may include one or more lift-pin feed-through features, each lift-pin feed-through feature centered on a reference circle with a diameter of between 90% and 100% of D, providing clear passage through the substrate support and the cooling plate in a direction substantially normal to the substrate support, and sized such that a lift-pin associated with the lift-pin feed-through does not contact the substrate support and the cooling plate when installed in the wafer support assembly. In some further implementations, the lift-pin feed-through features may include axial, open channels in an outermost surface of the substrate support and corresponding, non-open through-holes in the cooling plate.

In some implementations, the cooling plate may include one or more retaining features configured to mount a high-temperature cooler to the cooling plate on a side of the cooling plate opposite the first thermal contact patch and within a region substantially coextensive with the first area.

In some implementations, the first area may represent more than 95% of the contact area between the substrate support and the cooling plate. In some other implementations, the first area and the second area, in combination, may represent more than 95% of the contact area between the substrate support and the cooling plate.

In another implementation, a wafer support assembly for use in semiconductor processing may be provided. The wafer support assembly may include a substrate support and a cooling plate bonded to the substrate support across a first annular thermal contact area and otherwise offset from the substrate support by a gap. The wafer support assembly may also include a housing featuring an exterior wall, the housing mated to the cooling plate via a hermetic interface located on a face of the exterior wall and including cooling passages located in the exterior wall in the vicinity of the hermetic interface. The wafer support assembly may also include a high-temperature cooler in thermal contact with the cooling plate over a second annular thermal contact area. The thermal resistance of the cooling plate between the first annular thermal contact area and the second annular thermal contact area may be less than the thermal resistance between the first annular thermal contact area and the hermetic interface.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

BRIEF DESCRIPTION OF THE DRAWINGS

While FIGS. 1-4 depict unscaled, conceptual drawings, FIGS. 5-10 are scaled drawings.

DETAILED DESCRIPTION

Examples of various implementations are illustrated in the accompanying drawings and described further below. It will be understood that the discussion herein is not intended to limit the claims to the specific implementations described. On the contrary, it is intended to cover alternatives, modifications, and equivalents as may be included within the spirit and scope of the invention as defined by the appended claims. In the following description, numerous implementation-specific details are set forth in order to provide a thorough understanding of the present invention. The present invention may be practiced without some or all of these implementation-specific details. In other instances, well-known process operations have not been described in detail in order not to unnecessarily obscure the present invention.

Figure 1:
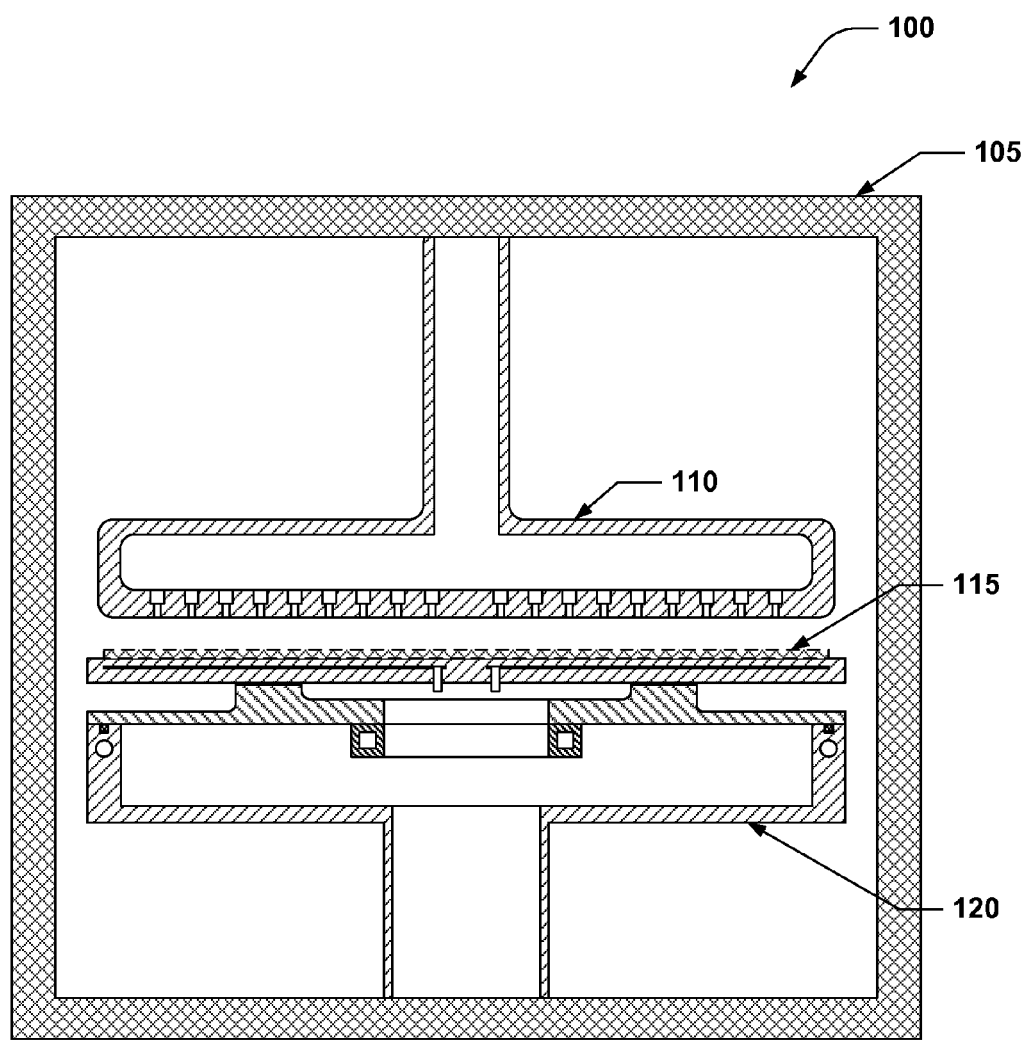
FIG. 1 depicts a high-level conceptual cutaway view of a semiconductor process chamber.

Most semiconductor wafer processing tools include a chuck or wafer support that supports the wafer during semiconductor wafer processing. For example, semiconductor tool 100 as shown in FIG. 1 may include chamber 105 and chuck 120 that supports wafer 115 within chamber 105 during semiconductor wafer processing operations within chamber 105. Showerhead 110 may be used to deliver process gases to wafer 115 during wafer processing. Chuck 120 may be an electrostatic chuck (ESC) that clamps wafer 115 to chuck 120 using electrostatic forces, although other clamping technologies may also be used. Chuck 120 may also include RF electrodes used for sparking plasmas within chamber 105. Chuck 120 may include heater elements or cooling passages to facilitate temperature management.

During processing, a chuck may be heated using the heater elements and brought to elevated temperatures relative to other equipment to which the chuck has a heat conduction flow path. Heat then flows from the chuck and the equipment that is thermally connected with the chuck. If this heat flow occurs at too high a rate, more heat must be supplied from the heater elements in order to counterbalance the loss of heat from the chuck and to keep the chuck at the desired elevated temperature. This may require a larger heater requiring a larger power supply or presenting other logistical issues. A suitably large heater may also not be available.

One potential technique for mitigating such heat flow is to place the chuck atop an axial thermal choke that acts as a thermal restrictor to slow heat flow from the chuck to the lower-temperature parts. For example, the chuck or substrate support may be supported within the chamber by a thin-wall tubular support column that acts as an axial thermal choke between the chuck and the larger, relatively low-temperature thermal mass of the process chamber. Unfortunately, such thermal restrictors may also restrict the flow of heat during low-temperature operations and may result in the chuck gradually heating up due to heat imparted to it during wafer processing. Implementations described herein utilize one or more radial thermal chokes to provide a wide range of cooling and heating performance in a chuck. Radial thermal chokes restrict heat flow in a primarily radial direction, e.g., through a structure where the cross-sectional area generally increases or decreases exponentially along the primary direction of heat flow, as compared to axial thermal chokes that restrict heat flow in a primarily axial direction, e.g., through a structure where the cross-sectional area generally remains constant along the direction of heat flow.

Figure 2A:
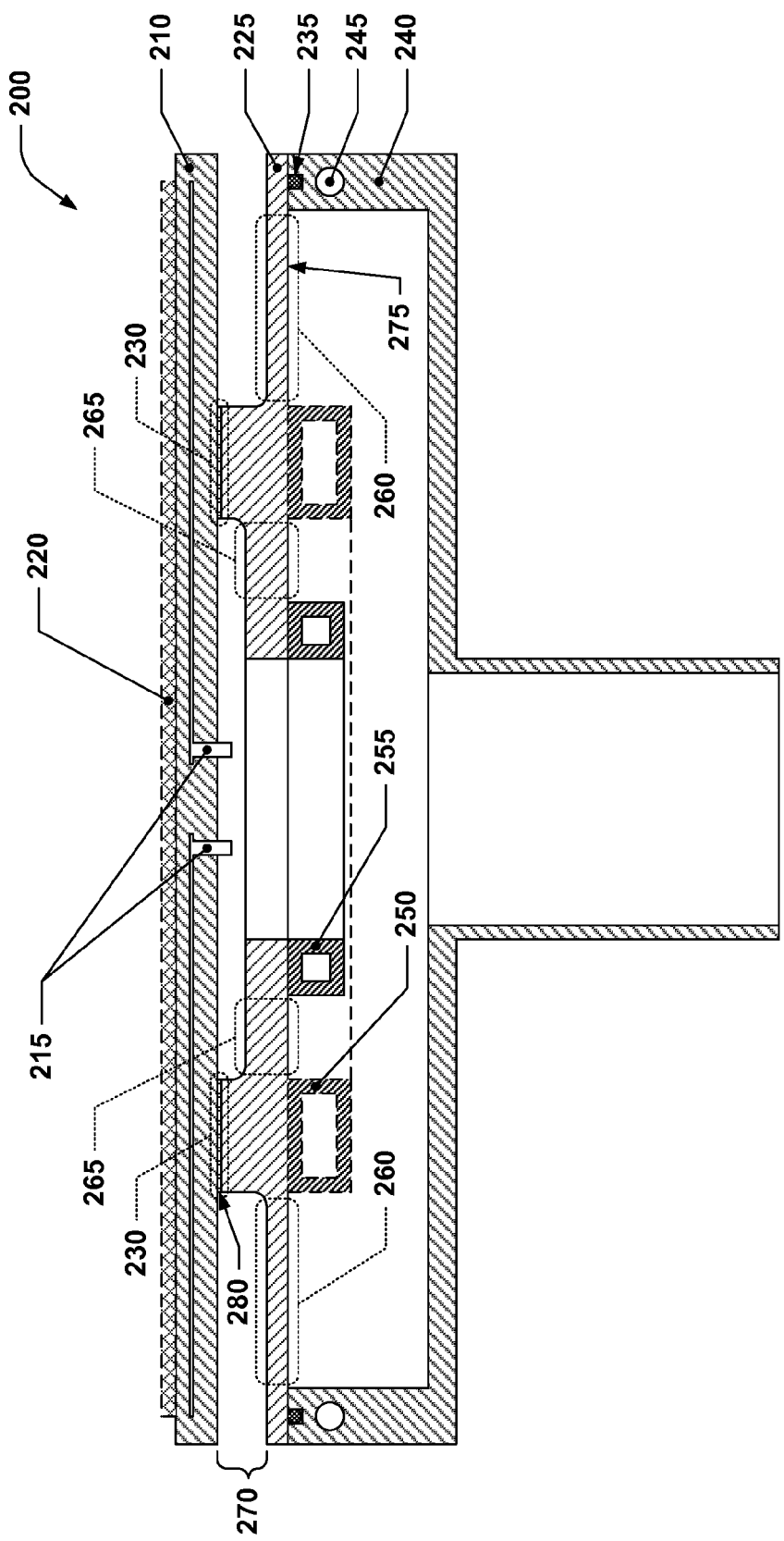
FIG. 2A depicts a conceptual sectional view of a chuck with two radial thermal chokes.

In one example implementation, shown in FIG. 2A, chuck 200 may include wafer support 210, which includes electrodes 215. Wafer support 210 may be made from a ceramic such as Aluminum Nitride (AlN), Aluminum Oxide ($Al_2O_3$), or other material with a coefficient of thermal expansion (CTE) similar to that of wafer 220, i.e., relatively low in value. Wafer support 210 may also include heater elements (not shown) configured to provide heat to wafer support 210 and, through conduction, to wafer 220 as well. The heater elements may be embedded within wafer support 210 or mounted externally. Such heater elements may, for example, include resistive heater elements or wires routed in a serpentine or looping fashion within wafer support 210.

Chuck 200 may also include cooling plate 225, which may be bonded to wafer support 210 over thermal contact patch 230. The bond may be a diffusion bond using aluminum foil as interface layer 280, although other bonding techniques and interface materials, such as tantalum, a nickel-vanadium alloy, or heat-conductive polymers, may be used. In some implementations, e.g., a direct bond, a separate interface layer 280 is not used in the bonded area. Cooling plate 225 may be made from a non-magnetic material with similar CTE to that of wafer support 210, such as molybdenum. Cooling plate 225 may also be made from a ferrous material, such as nickel-cobalt-iron alloys (such as Kovar™), in applications where magnetic fields will not be disrupted by the presence of an iron alloy. Cooling plate 225 may also be made from two or more materials. For example, the central region of cooling plate 225 may be made from molybdenum and the outer region of cooling plate 225 may be made from a nickel-cobalt-iron alloy. These two regions may then be bonded together to form a single, multi-material component.

While cooling plate 225 and wafer support 210 may be in direct thermal contact with each other through the bond over thermal contact patch 230, cooling plate 225 and wafer support 210 may otherwise be separated by gap 270. While heat transfer between cooling plate 225 and wafer support 210 may still occur across gap 270, this heat transfer is almost completely limited to radiative heat transfer during processing in which the process chamber is held at a vacuum or near-vacuum, i.e., little or no convective heat transfer, or conductive heat transfer via gas, occurs across gap 270 under these conditions. In some implementations, a material may be used to occupy substantially all of the gap. The material may be used to protect the surfaces of cooling plate 225 and wafer support 210 defining the gap from plasma reactions. To prevent or mitigate heat conduction through the protective material, the protective material may be a high-performance thermal insulator. Alternatively, the material may extend through most of the gap, but not through all of the gap. In effect, this will shrink the gap width to the point where it is difficult for plasma to form within the gap. However, because there is still a gap in these scenarios, heat conduction across the gap is effectively prevented in this scenario when the chamber is under vacuum.

Figure 2B:
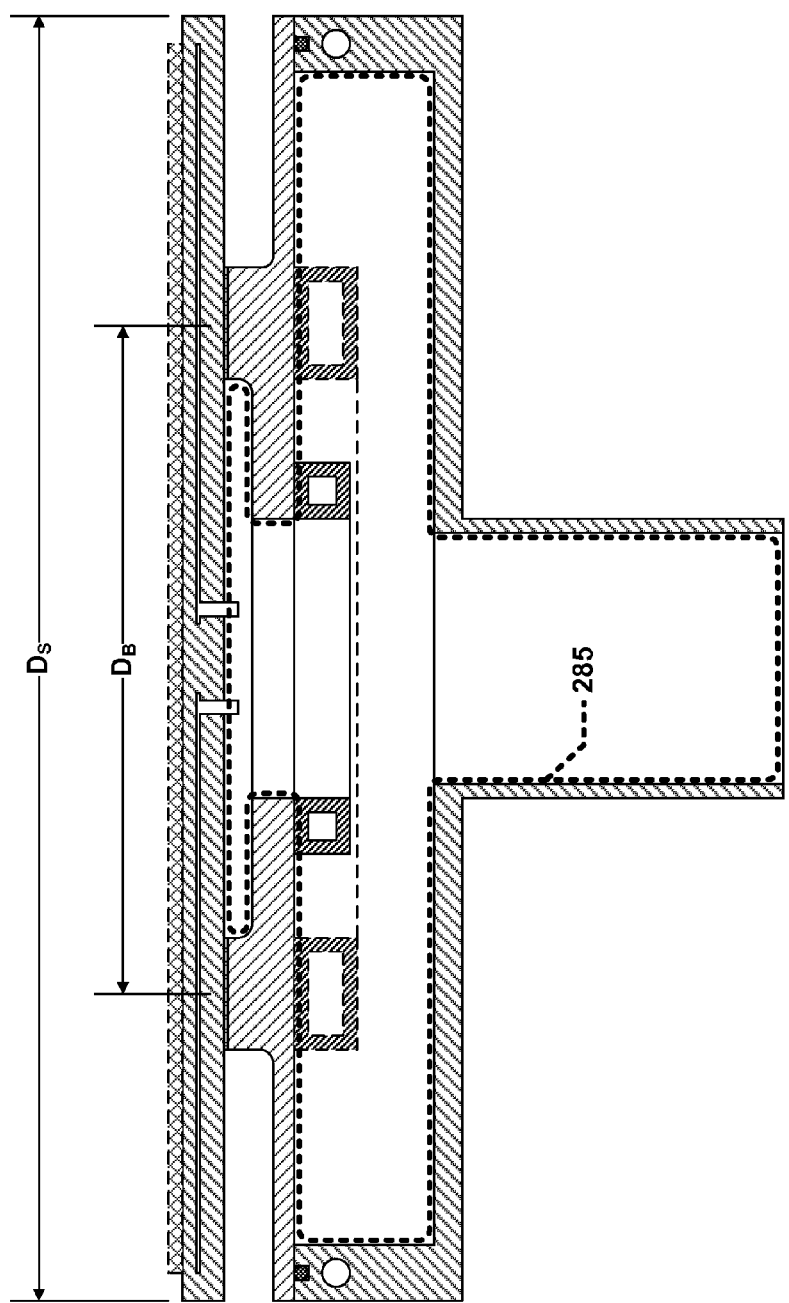
FIG. 2B highlights two dimensional elements in FIG. 2A.

Thermal contact patch 230 may be located approximately at the midpoint of the radius of wafer support 210. Thermal contact patch 230 may be substantially annular in shape and the annular thickness may be approximately 1", i.e., the difference between the outer and inner radii of the thermal contact patch may be approximately 1". The annular thickness may be configured to provide a heat flow path that does not substantially impact downstream heat flow, i.e., thermal contact patch 230 and the adjoining structure in cooling plate 225 readily conduct heat compared with the radial chokes of cooling plate 225 described elsewhere herein. Thermal contact patch 230's annular thickness may be increased to facilitate additional heat flow, although overly-aggressive increases in annular thickness may lead to undesirable thermal expansion issues. Annular thickness refers to the value of half of the difference between the inner and outer diameters of an annulus. In some implementations, the location of thermal contact patch 230 may be located according to the relationship:

$$\frac{D_S}{D_B} = \sqrt{e}$$

where $D_S$=the diameter of the wafer support, $D_B$=the average diameter of the thermal contact patch/bond, i.e., the sum of the outer and inner diameters of the thermal contact patch divided by 2, and where e=Euler's number, i.e., the exponential function to the power 1 (2.71828 . . . ). FIG. 2B illustrates these dimensions. According to this relationship, the average diameter of the thermal contact patch in some implementations is approximately 60-61% of the diameter of the wafer support. For example, if $D_S$ is ~12", $D_B$ may be ~7.3". In some implementations, thermal contact patch 230 may have inner and outer radii of 3" and 4". Wafer support 210 may be sized to support a variety of different wafer sizes and is not limited to a 12" nominal size. Some implementations may have an average diameter of the thermal contact patch that is within 55-65% or 50-70% of the diameter of the wafer support.

Backside face 275 of cooling plate 225 may be substantially planar and may include features for interfacing to hermetic interface 235 and an exterior wall of housing 240. Structures similar to housing 240 may also be referred to herein as "pedestals." Such hermetic interface features may include blind or through holes (threaded or unthreaded), O-ring gland features, CF (ConFlat™) features, etc. A permanent hermetic seal may also be used, such as a weld, braze, or other bond; in such implementations, the hermetic seal features, such as weld grooves, may be consumed during the formation of the hermetic seal.

Housing 240 may be made from aluminum or other suitable material and feature hermetic interface features configured to mate with the hermetic interface features on backside face 275 of cooling plate 225. Housing 240 may have an exterior wall or rim that incorporates housing cooling channel 245 within the wall or in thermal contact with the wall. Housing cooling channel 245 may be configured to regulate the temperature of the housing in the vicinity of hermetic interface 235. For example, housing cooling channel 245 may be configured to circulate sufficient coolant to maintain the area in the vicinity of the hermetic interface at approximately 20° C. during semiconductor processing operations. If a temperature-resistant hermetic seal technology is used, such as a high-temperature O-ring seal, the housing cooling channel may be configured to keep the hermetic interface at a higher temperature. In some implementations, such as when hermetic seal interface 235 is largely insensitive to semiconductor process temperatures, e.g., a weld, housing cooling channel 245 may not be required.

Features for interfacing to high-temperature cooling passage 255 may also be included. Such high-temperature cooling passage interface features may include hole patterns configured to receive fasteners to clamp high-temperature cooling passage 255 to backside face 275 of cooling plate 225. The hole patterns may include threaded blind or through-holes in cooling plate 225. Alternatively, the hole patterns may include through-holes with corresponding nut plates affixed to cooling plate 225. Nut plates may be used with cooling plate 225 when cooling plate 225 is made of a material un-conducive to threading operations, e.g., molybdenum. Cooling plate 225 may include several such hole patterns, each of which may be used to support a different size high-temperature cooling passage 255. In this way, one bonded cooling plate 225/wafer support 210 assembly may be used to support a variety of different process thermal environments. If bonded cooling plate 225/wafer support 210 assembly is to be reconfigured, the currently installed high-temperature cooling passage 255 may be removed and replaced with a differently-sized high-temperature cooling passage 255. Fastening techniques other than hole patterns/fasteners may also be used to thermally connect high-temperature cooling passage to cooling plate 225. For example, a system of springs or clips may be used instead. Although not shown, a thermally-conductive interface material, such as a paste, may be used to enhance conductive heat from cooling plate 225 to high-temperature cooling passage 255. High-temperature cooling passage 255 may be substantially annular in shape and may contact cooling plate 225 over an annular thermal contact area with inner and outer radii of 2" and 2.5".

Cooling plate 225 may also be optionally connected with low-temperature cooling passage 250. Low temperature cooling passage 250 may be brought into thermal contact with cooling plate 225 using features similar to those used to support high-temperature cooling passage 255. Low-temperature cooling passage 250 may not need to be installed in some configurations. In configurations where low-temperature cooling passage 250 is installed, low-temperature cooling passage 250 may occupy a region on backside face 275 substantially co-extensive with or within the perimeter of thermal contact patch 230 when viewed along an axis substantially normal to cooling plate 225. Chuck 200 may be operated with low-temperature cooling passage 250 installed but with no coolant flowing through low-temperature cooling passage 250. A thermally-conductive interface material, such as a paste, may also be used to enhance conductive heat from cooling plate 225 to optional low-temperature cooling passage 250. As with high-temperature cooling passage 255, low-temperature cooling passage 250 may be substantially annular in shape. It is to be understood that the cooling passages, both high-temperature and low-temperature, described herein may also take other shapes, including near-annular or C-shaped shapes, and may be comprised of multiple passages in series or parallel. The cooling passages may be configured to remove heat from a substantially annular thermal contact region while having a non-annular overall shape.

Cooling plate 225 may be constructed to provide for two radial thermal chokes: first radial thermal choke 260 and second radial thermal choke 265. A thermal choke is a structure that is designed to restrict heat flow and is typically engineered to provide a particular thermal resistance across the thermal choke structure. While every material or structure impedes heat flow to some degree, a thermal choke is an element that is designed to substantially restrict heat flow along a conduction path beyond the restriction on heat flow provided by an upstream element on the path. For example, second radial thermal choke 265 has a substantially thinner cross section than the portion of cooling plate 225 between thermal contact patch 230 and low-temperature cooling channel 250. Second radial thermal choke 265 would therefore act to substantially restrict heat flowing from thermal contact patch 230 to high-temperature cooling channel 255. By contrast, the portion of cooling plate 225 between thermal contact patch 230 and low-temperature cooling channel 250 would provide no substantial heat flow restriction for heat flowing from thermal contact patch into low-temperature cooling channel 250.

Thermal chokes are, in many ways, analogous to fluid flow restrictors or electrical resistors in that these structures all resist some type of flow, e.g., heat flow, fluidic flow or electrical current. Of course, the factors that determine the degree of resistance vary with respect to the type of flow being restricted. For example, electrical resistance may be largely unaffected by the overall shape of the conductor through which current is flowed, whereas fluid flow resistance may be heavily affected by the number of turns or bends that a fluid flow path undergoes.

Thermal chokes are also not to be confused with other components that may introduce other heat flow paths, i.e., potential electrical or gas connections to wafer support 210. Thermal chokes are designed and intended to be the primary heat flow paths in a thermal system, i.e., the thermal chokes of a thermal system are designed to conduct, in aggregate, substantially all of the heat that flows from the system via conduction. While other incidental heat flow paths may exist that have high heat flow resistance, such flow paths cannot be considered to be thermal chokes since they do not contribute meaningfully to overall heat flow. For example, a temperature sensor may be used to measure the temperature of the wafer support; the temperature sensor may have a wire connecting it to electronics in the chuck housing. While that wire may have a high thermal resistance due to the wire's relatively long length and small diameter, the wire should not be viewed as a thermal choke because it does not contribute meaningfully to the overall heat flow within the chuck. For the purposes of this application, it is to be understood that electrical signal or power cables (and any associated cladding or insulation) and gas or fluid supply/return lines are not considered to be "thermal chokes."

If low-temperature cooling passage 250 is installed, it may be used to remove heat that would otherwise be forced to flow through radial thermal chokes 260 or 265. In this manner, the thermal choking effect of thermal chokes 260 or 265 may be effectively bypassed and rapid cooling of cooling plate 225 may be achieved.

Thermal chokes used with semiconductor manufacturing chucks are typically of the axial type, i.e., the thermal resistance imparted by an axial choke is applied to heat flowing in a primarily axial direction. For example, a low-CTE tube may be used to support a chuck that is at high temperature and connect the chuck with low-temperature equipment; in such configurations, a temperature differential is formed between one end of the tube and the other. The thermal resistance of such an axial thermal choke is dependent on the length of the tube and the temperature difference over that length. Since the temperatures at either end of the tube are typically determined by process parameters, the only readily available means of adjusting the thermal resistance of an axial thermal choke is to lengthen or shorten the tube itself.

Whereas an axial thermal choke applies thermal resistance to heat flowing in a primarily axial direction, a radial thermal choke applies thermal resistance to heat flowing in a primarily radial direction. As noted, cooling plate 225 features at least two radial thermal chokes. Second radial thermal choke 265 includes the annular portion of cooling plate 225 located between thermal contact patch 230 and high-temperature cooling passage 255. First radial thermal choke 260 includes the annular portion of cooling plate 225 located between thermal contact patch 230 and the exterior wall of housing 240.

In addition to providing thermal management features, cooling plate 225 also provides structural support to wafer support 210 and acts as a pressure vessel wall with regard to the interior of chuck 200. For example, the interior volume 285 of chuck 200 may be held at atmospheric pressure during semiconductor processes where the semiconductor processing chamber and exterior of chuck 200 are held at vacuum. In such scenarios, cooling plate 225 must have sufficient structure to withstand a pressure loading of approximately one atmosphere applied to cooling plate 225 and wafer support 210. This is but one example loading scenario—other pressure differentials could be encountered as well, and cooling plate 225 may be designed to withstand such pressures as appropriate.

The structural portions of cooling plate 225 may also conduct heat and may present heat management issues. First radial thermal choke 260 and second radial thermal choke 265 may be used to manage such heat conduction.

As shown in FIG. 2A, high-temperature cooling passage 255 may be located within the internal diameter of thermal contact patch 230, and second radial thermal choke 265 comprises the portion of cooling plate 225 between the internal diameter of thermal contact patch 230 and the outer diameter of high-temperature cooling passage 255. As further shown in FIG. 2A, first radial thermal choke 260 may include the portion of cooling plate 225 between the outer diameter of thermal contact patch 230 and the exterior wall of housing 240.

Heat flow between two points is dependent on several characteristics. As mentioned above, the temperature difference between those two points is one factor; a higher temperature difference will result in greater heat flow. As mentioned above, those temperatures are largely determined by process conditions. For example, plasma processing operations may require that the wafer be kept at approximately 250° C.; the chuck may need to be kept at a similarly elevated temperature. The pedestal base supporting the chuck may, however, be kept at room temperature, e.g., 20° C.

Another factor that may influence heat flow is the thermal conductivity of the various materials in the heat flow pathway. If cooling plate 225 is formed from a single material, the thermal conductivity of cooling plate 225 will remain effectively constant throughout cooling plate 225, aside from minor shifts of thermal conductivity due to local temperature values. In some implementations, as discussed previously, cooling plate 225 may be formed from two different materials. For example, the portion of cooling plate 225 that corresponds with second radial thermal choke 265 may be formed from molybdenum, which may have a thermal conductivity of approximately 138 W/mK, and the portion of cooling plate 225 that corresponds with first radial thermal choke 260 may be formed from a nickel-cobalt-iron alloy, which may have a thermal conductivity of approximately 17 W/mK, i.e., nearly ⅛ of the thermal conductivity of the second radial thermal choke material. While molybdenum and nickel-cobalt-iron alloys may have very different thermal conductivities, they may have much more similar coefficients of thermal expansion, e.g., approximately $5.1 \times 10^{-6}/°$ C. for nickel-cobalt-iron alloys and approximately $4.8 \times 10^{-6}/°$ C. for molybdenum, i.e., within approximately 10% of each other.

An additional factor that may influence heat flow is the geometry through which heat flow occurs. Heat flowing through a plane wall will flow through the wall in accordance with Fourier's law, which states:

$$q = \frac{Ak}{x}(T_1 - T_2)$$

where q is the amount of heat flow, k=thermal conductivity, $T_1$ and $T_2$ are the temperatures on either side of the wall, A is the cross-sectional area of the wall, and x is the wall thickness. Thermal conductivity for a material may vary with temperature of the material, although such variability may be accounted for when performing heat conduction calculations, e.g., by using a representative average thermal conductivity. In the plane wall scenario, A remains constant for all values of x. Such an equation can be used to calculate heat conduction through an axial thermal choke.

For radial thermal chokes, the heat flows in a radial direction and the cross-sectional area through which the heat flows varies depending on radial position. Fourier's law can be modified for use with radial heat flow:

$$q = \frac{2\pi k L}{\ln \frac{r_1}{r_2}}(T_1 - T_2)$$

where q is the amount of heat flow, k=thermal conductivity, $T_1$ is the temperature at the outer diameter $2r_1$ of the radial thermal choke, $T_2$ is the temperature at the inner diameter $2r_2$ of the choke, and L is the axial thickness of the radial thermal choke. The quantity:

$$K = \frac{2\pi k L}{\ln \frac{r_1}{r_2}}$$

can be thought of as the overall thermal conductance K of the radial thermal choke; it is dependent not only on the thermal conductivity of the choke material, but on the choke geometry as well. The inverse of thermal conductance is thermal resistance, which is sometimes used in heat transfer discussions instead.

In the implementation shown in FIG. 2A, the overall thermal conductance of the second radial thermal choke is configured to be greater than the overall thermal conductance of the second radial choke. This may be accomplished by varying the radial length and axial thickness for each choke. For example, the second radial thermal choke may be approximately 0.2" thick and 0.5" in radial length, i.e., with a radial length/axial thickness aspect ratio of approximately 2:5. The first radial thermal choke may be approximately 0.1" thick and 1.5" in radial length, i.e., with a radial length/axial thickness aspect ratio of approximately 1:15. In such a configuration, the ratio of the thermal conductance of the second radial thermal choke to the thermal conductance of the first radial thermal choke is approximately 4:1, i.e., the ratio of the thermal resistance of the first radial thermal choke to the second radial thermal choke is approximately 4:1.

Figure 3:
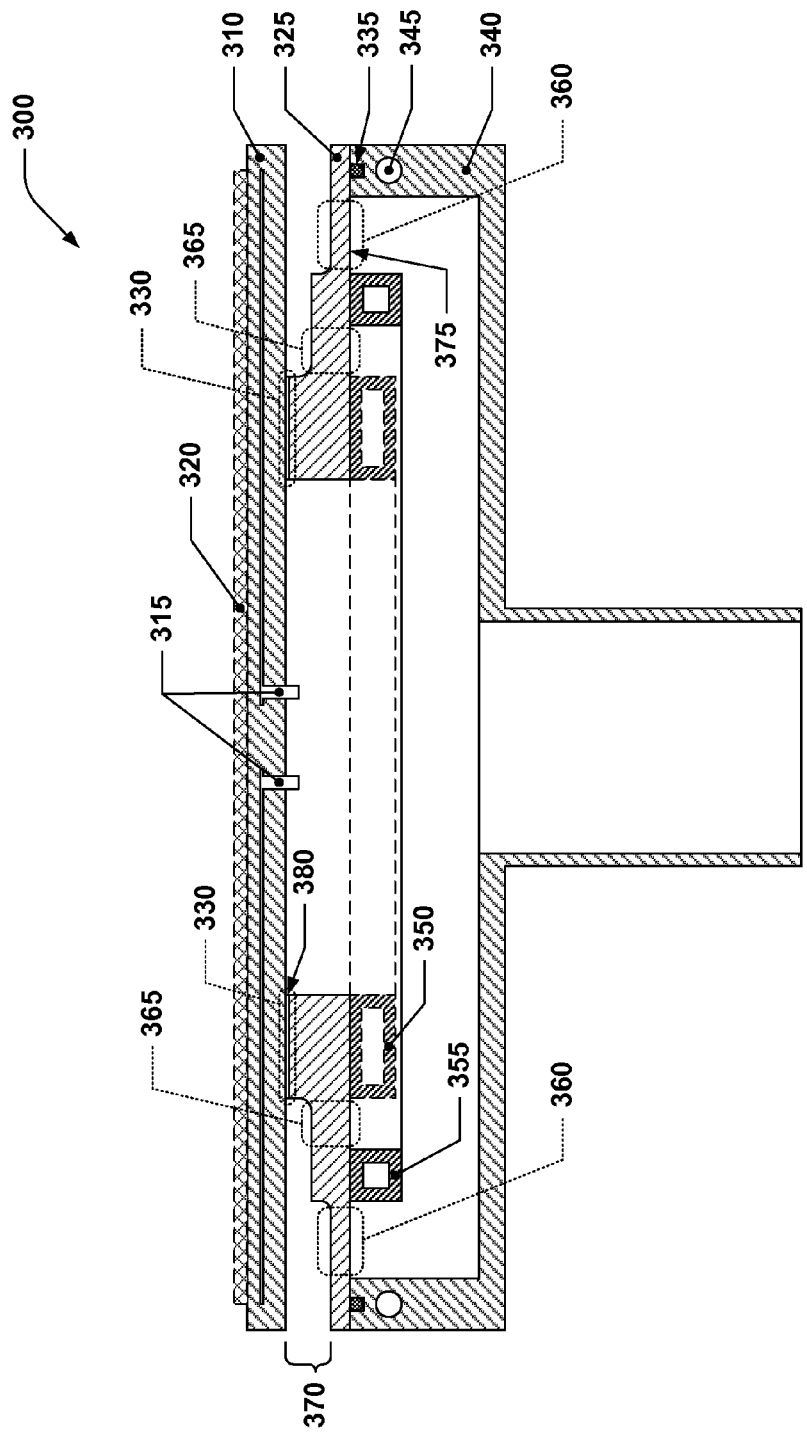
FIG. 3 depicts a conceptual sectional view of a chuck with an alternate implementation of two radial thermal chokes.

A different implementation is depicted in FIG. 3. Many of the features shown in FIG. 3 are similar or functionally similar to features shown in FIG. 2A. Unless otherwise noted, items in FIG. 3 that are designated with callouts ending in the same last two digits as items in FIG. 2A may be described in a manner similar to how the corresponding item in FIG. 2A is described.

In FIG. 3, high-temperature cooling channel 355 is located between thermal contact patch 330 and hermetic interface 335. Second radial thermal choke 365 corresponds to the region of cooling plate 325 between high-temperature cooling channel 355 and thermal contact patch 330. First radial thermal choke 360 corresponds to the region of cooling plate 325 between high-temperature cooling channel 355 and hermetic interface 335.

Figure 4:
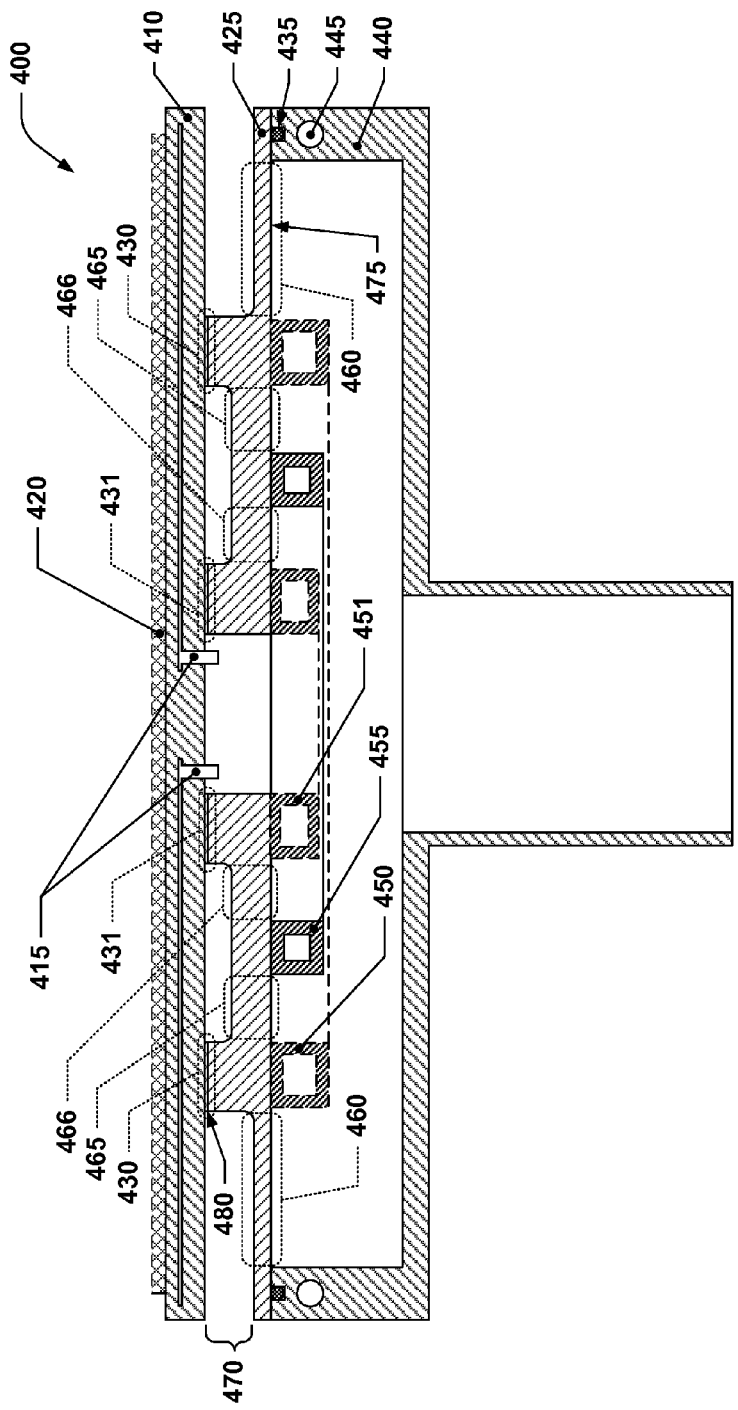
FIG. 4 depicts a conceptual sectional view of a chuck with an implementation including three radial thermal chokes.

FIG. 4 depicts another implementation in which a third radial thermal choke is used. Many of the features shown in FIG. 4 are similar or functionally similar to features in FIGS. 2A and 3. Unless otherwise noted, items in FIG. 4 that are designated with callouts ending in the same last two digits as items in FIG. 2A and FIG. 3 may be described in a manner similar to how the corresponding items in FIGS. 2A and 3 are described. In this implementation, a second annular thermal contact patch 431 is included, resulting in two annular thermal contact patches that conduct heat from the wafer support to the cooling plate. A high-temperature cooling channel 455 may be located on the backside face 475 of cooling plate 425 approximately midway between the two thermal contact patches. In the implementation shown in FIG. 4, there may actually be three radial thermal chokes. First radial thermal choke 460 may be located between the outer diameter of first thermal contact patch 430 and exterior wall of housing 440. Second radial thermal choke 465 may be located between the inner diameter of first thermal contact patch 430 and the outer diameter of high-temperature cooling channel 455. Third radial thermal choke 466 may be located between the inner diameter of high-temperature cooling channel 455 and the outer diameter of second thermal contact patch 431. Optional low-temperature cooling passages 450 and 451 (shown by dashed lines) may also be employed in areas substantially coextensive with the thermal contact patches.

With further reference to FIG. 4, the location of high-temperature cooling channel 455 may be shifted from the midway location discussed above in order to balance the thermal resistances of the first, second, and third radial thermal chokes. For example, with the high-temperature cooling channel midway between the two thermal contact patches shown in FIG. 4, additional heat may be conducted away from first thermal contact patch 430 by virtue of the additional heat flow path provided by first radial thermal choke 460. This may result in a temperature difference between both thermal contact patches. To counteract this, it may be necessary to shift the high-temperature cooling channel inwards to a smaller diametric location.

Figure 5:
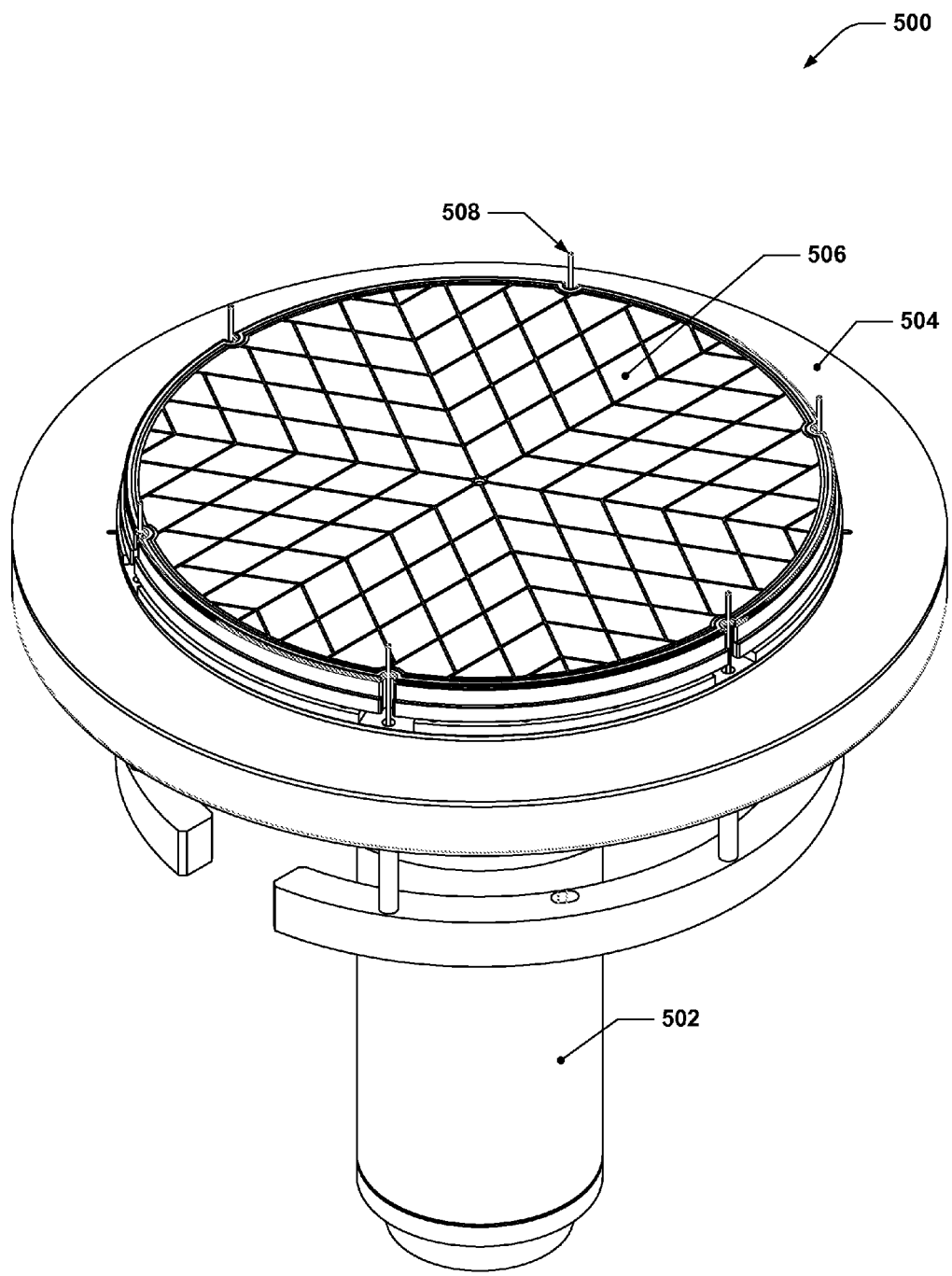
FIG. 5 depicts an isometric view of an example wafer support assembly featuring a wafer support featuring radial thermal chokes.

FIG. 5 depicts an isometric view of another example of an implementation of a wafer support assembly utilizing radial thermal chokes. Wafer support assembly 500 may include wafer support 506, lift-pins 508, pedestal 504, and support column 502. While wafer support 500 is shown with a diamond pattern of gas flow channels recessed into its face, other wafer supports may be used as well with different patterns of recesses or, in some cases, no recesses at all. The lift-pins shown are located about the edge of wafer support 506 and are located within open axial channels spaced about the circumference of wafer support 506, although other implementations may feature lift-pin feed-through locations that pierce wafer support 506, e.g., locations set some distance inwards towards the center of wafer support 506. Pedestal 504 extends radially beyond the edge of wafer support 506 in the pictured implementation, although other implementations may include a pedestal that is substantially the same diameter as wafer support 506 or that extends beyond wafer support 506 to a lesser or greater extent.

Figure 6:
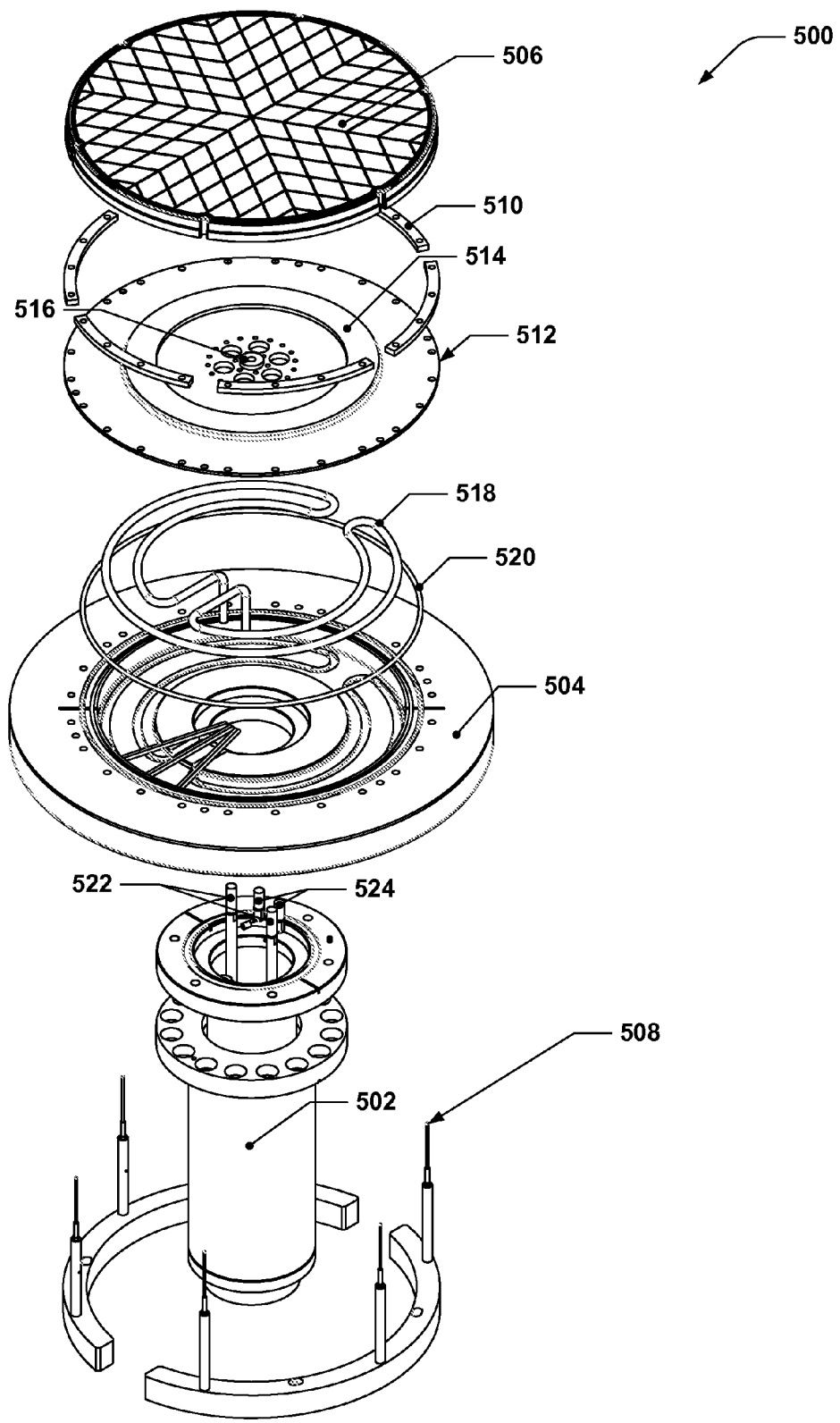
FIG. 6 depicts an isometric exploded view of the example wafer support assembly of FIG. 5.

FIG. 6 depicts an exploded isometric view of wafer support assembly 500. In addition to wafer support 506, pedestal 504, lift-pins 508, and support column 502, various other components may be observed. For example, cooling plate 512 is visible, including first thermal contact patch 514 and second thermal contact patch 516. Also visible are nut plates 510, that may be used to secure cooling plate 512 to pedestal 504. Nut plates 510 may include a plurality of threaded holes or other fastener interface features, allowing threaded fasteners (not shown) fed through the underside of pedestal 504 to engage with nut plates 510 and clamp cooling plate 512 to pedestal 504. Pedestal O-ring 520 may be sandwiched between cooling plate 512 and pedestal 504 to form a hermetic seal across the clamping region. Also visible is pedestal cooling line 518 routed in a double-C configuration; only a portion of pedestal cooling line 518 in the immediate vicinity of pedestal 504 is shown, i.e., the terminal fittings/portions within the support column have been omitted for clarity.

FIG. 6 also depicts RF electrode feed lines/terminals 522, as well as heater terminal lugs 524. RF electrode feed lines/terminals 522 and heater terminal lugs 524 may both connect with electrode and heater elements, respectively, embedded within substrate support 506. As such, portions of these items may be permanently attached to the substrate support 506—for convenience, however, these components are shown separate from substrate support 506 in FIG. 6.

Figure 7:
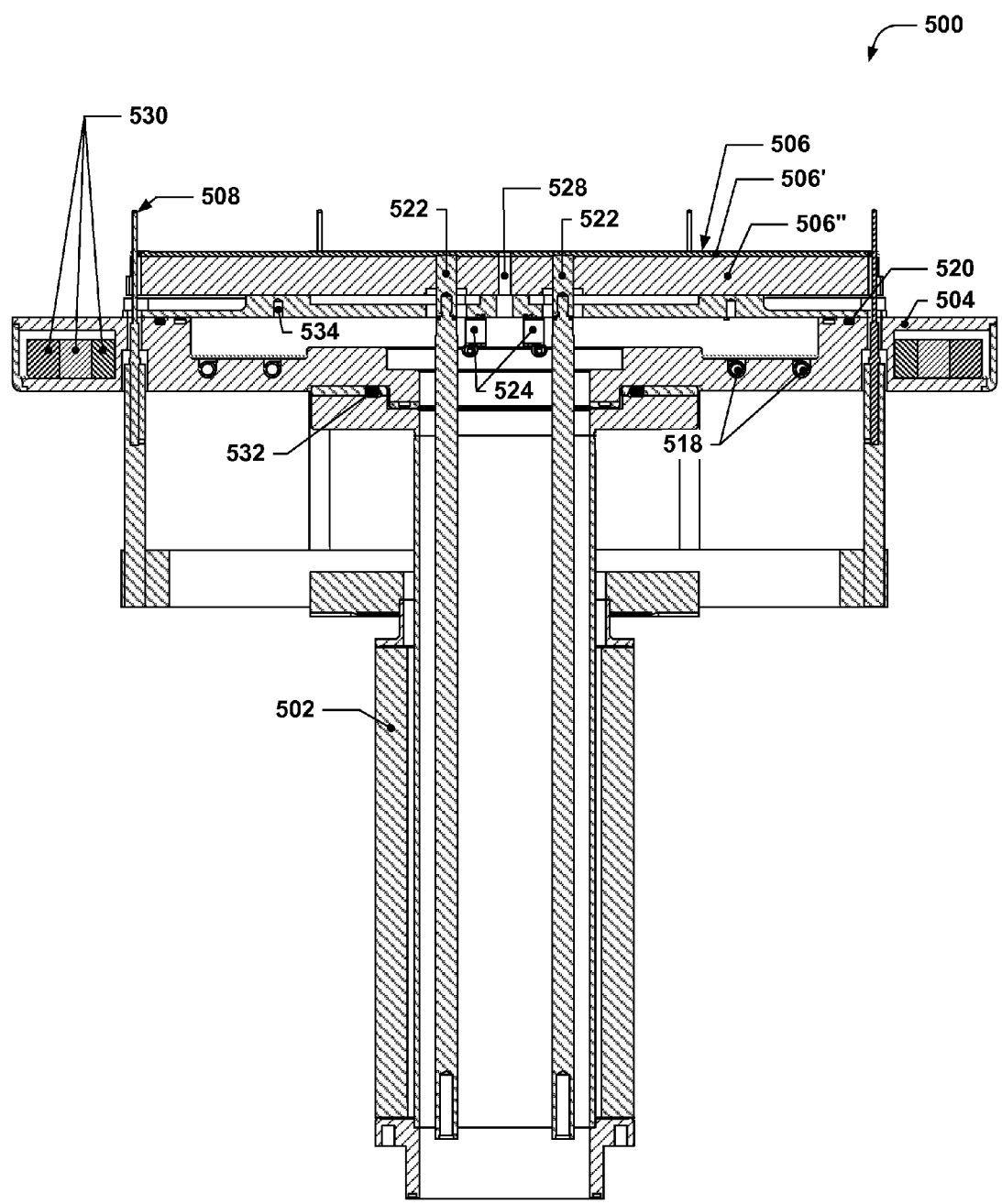
FIG. 7 depicts a side section view of the example wafer support assembly of FIG. 5.

FIG. 7 depicts a side section view of wafer support assembly 500. Additional internal features and component relationships are visible in FIG. 7. For example, wafer support 506 may include an upper portion 506' and a lower portion 506". An RF electrode (not shown) may be embedded between the two portions or within either portion. It is to be understood that wafer support 506 may be a single, integrated component and that upper portion 506' and lower portion 506" may simply refer to different regions of the same part. Wafer support 506 may also include embedded heater elements, such as a resistive heater wire or trace (not shown) embedded within wafer support 506 in a serpentine or otherwise circuitous manner. As can be seen, in the non-exploded state, RF electrode feed lines/terminals 522 protrude into and terminate within wafer support 506 at the embedded electrodes (not shown).

Figure 8:
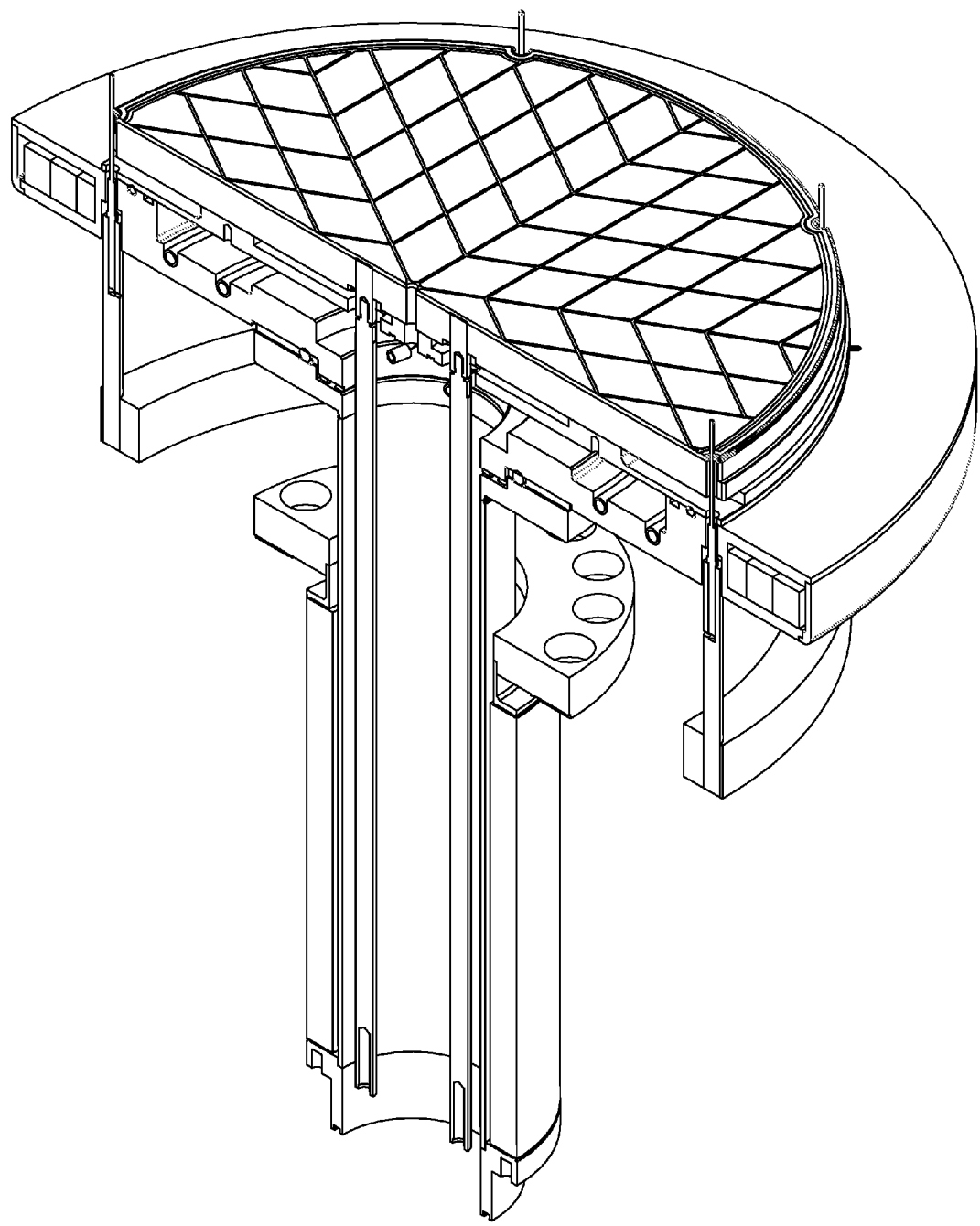
FIG. 8 depicts an isometric section view of the example wafer support assembly of FIG. 5.

FIG. 7 also depicts support column O-ring 532, that may be used to hermetically seal pedestal 504 to support column 502. Pedestal 504 may also, in some implementations, include one or more annular electromagnetic coils 530 in a cavity about the periphery of pedestal 504. FIG. 8 depicts an isometric cutaway view of wafer support assembly 500 for further clarity.

Figure 9:
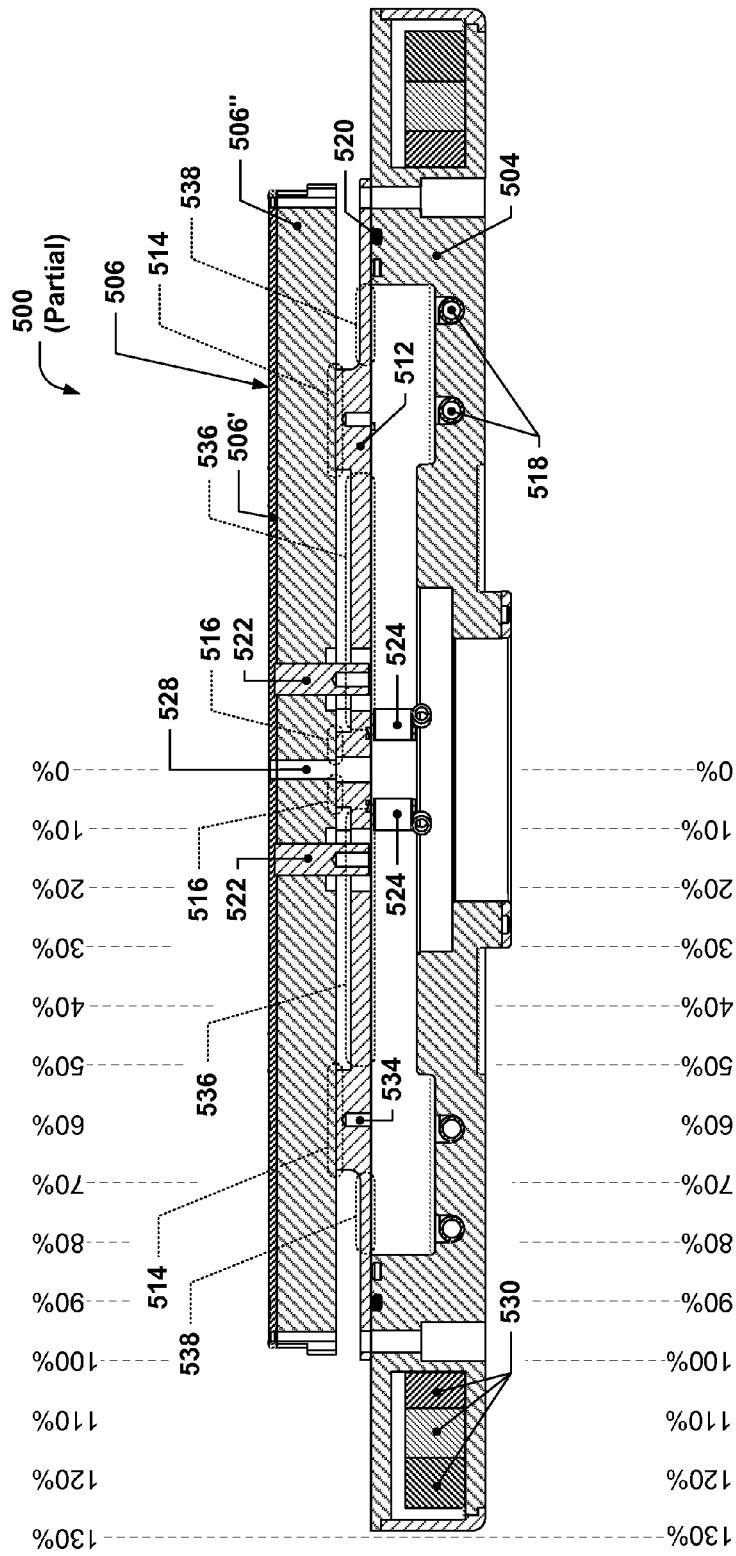
FIG. 9 depicts a side section view of the substrate support, cooling plate, and pedestal of the example wafer support assembly of FIG. 5.
Figure 10:
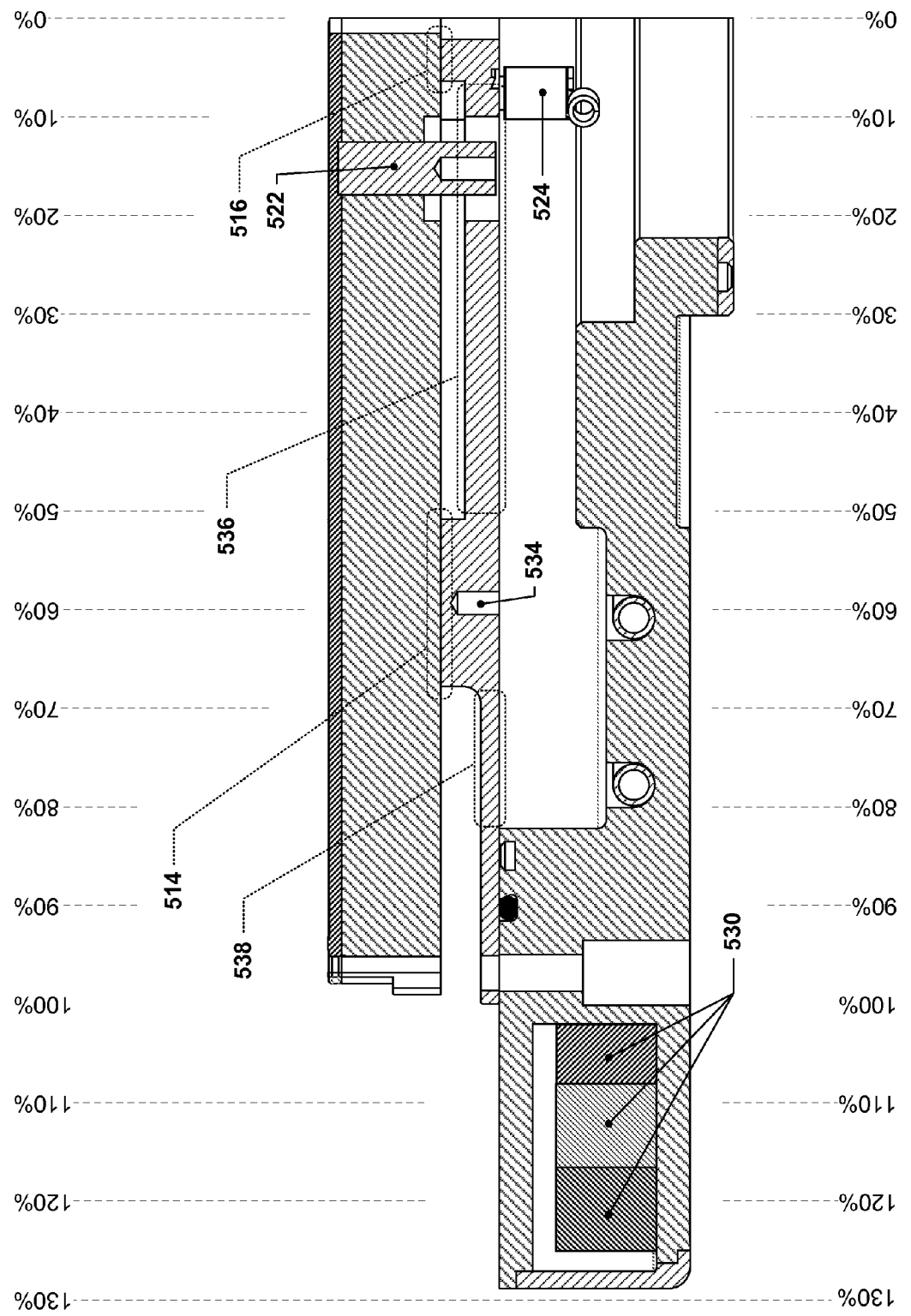
FIG. 10 depicts a side section detail view of one half of the substrate support, cooling plate, and pedestal of the example wafer support assembly of FIG. 5.

FIGS. 9 and 10 depict a side section view and partial side section view, respectively, of the wafer support 506, the cooling plate 512, and the pedestal 504 in greater detail. Also included in FIGS. 9 and 10 are graduated indexes corresponding with various fractions of the diameter or radius of wafer support 506. These graduated indexes are approximate and may, for example, provide insight as to relative locations of various components in terms of the percentage of wafer support 506's nominal diameter.

As can be seen in FIGS. 9 and 10, wafer support 506 may contact cooling plate 512 at first thermal contact patch 514 and at second thermal contact patch 516. One or both of these contact interfaces may be a bonded interface. For example, it may be desirable to utilize a bonded interface for second thermal contact patch 516 to prevent purge gas fed through purge gas feed 528 from leaking into the gap between substrate support 512 and cooling plate 512. It may also be desirable to prevent gas within the wafer support assembly, e.g., gas in the cavity formed between cooling plate 512 and pedestal 504, from escaping into the process environment. A bonded interface at second thermal contact patch 516 may ensure that there is minimal or no leakage at this interface. Purge gas feed 528 may be supplied with gas via a gas supply line (not shown) that is hermetically sealed to the backside face of cooling plate 512.

First thermal contact patch 514 may have an average diameter of between 50% and 70% of the nominal diameter of wafer support 506. In FIGS. 9 and 10, the average diameter of first thermal contact patch 514 is approximately 60% of the nominal outer diameter of substrate support 506. Second thermal contact patch 516 may have a nominal outer diameter less than 20% of the nominal outer diameter of substrate support 506. In FIGS. 9 and 10, the nominal outer diameter of second thermal contact patch 516 is approximately 5 to 8% of the nominal outer diameter of substrate support 506.

As can be seen, the thickness of cooling plate 512 may differ between first radial thermal choke 538 and second radial thermal choke 536. The radial extent of each radial thermal choke may differ as well. For example, first radial thermal choke 538 may extend radially for slightly more than 10% of the nominal radius of substrate support 506, while second radial thermal choke 536 may extend radially for over 40% of the nominal radius of substrate support 506.

For example, in some implementations featuring a wafer support with a nominal diameter of approximately 11.5" to 12", the thickness of cooling plate 512 across first radial thermal choke 538 may be approximately 0.09" to 0.13", e.g., 0.11", and first radial thermal choke 538 may extend for a distance of approximately 0.8" to 0.9", e.g., 0.85", in the radial direction. Similarly, the thickness of cooling plate 512 across second radial thermal choke 536 may be approximately 0.19" to 0.22", e.g., 0.2", and second radial thermal choke 536 may extend for a distance of approximately 2.375 to 2.875", e.g., 2.625", in the radial direction. In such implementations, first thermal contact area 514 may have an annular width of approximately 1" and an average diameter of approximately 7", and second thermal contact area 516 may have an annular width of approximately 0.25" and an average diameter of approximately 0.5".

In the implementation shown, cooling plate 512 may be substantially the same diameter as wafer support 506, although other diameters may be used as well. For example, cooling plate 512 may have an outer diameter that corresponds with the outer diameter of pedestal 504. Cooling plate 512 may interface with pedestal 504 through a substantially annular interface region about an outer portion of cooling plate 504. The interface region may include, for example, a hole pattern for threaded fasteners (not shown) that may be used to clamp cooling plate 512 to pedestal 504 using nut plates 510 (not shown in this view). Also included in the interface region may be pedestal O-ring 520 and/or an RF gasket (not shown, although a receptacle feature for such a gasket inwards of pedestal O-ring 520 is shown).

Pedestal 504 may be substantially cylindrical in shape, and have a large bore through the center to facilitate routing of gas lines, power cables, sensor cables, and other feeds to wafer support 506 and other components near wafer support 506. Pedestal 504 may include a recessed area in the center, resulting in an annular outer wall or rim outside of the recessed area. Cooling plate 512 may rest on top of this rim.

Wafer support assembly 500 may feature two radial thermal chokes. First radial thermal choke 538 may be in the region of cooling plate 512 bounded by the nominal outer diameter of first thermal contact patch 514 and the inner edge of the rim of pedestal 504, and second radial thermal choke 536 may be in the region of cooling plate 512 bounded by the nominal inner diameter of first thermal contact patch 514 and the nominal outer diameter of second thermal contact patch 516.

In the pictured implementation, there is no cooling passage in direct contact with cooling plate 512. In some implementations, adequate thermal performance may be obtained absent such a cooling passage—for example, cooling provided by pedestal cooling line 518 may be sufficient. However, if greater flexibility is desired in terms of thermal environments, one or more additional cooling passages may be affixed to the bottom side of cooling plate 512, similar to configurations shown in FIGS. 1-4. Cooling plate 512 may have additional features on the back side to facilitate mounting of such additional cooling passages, e.g., threaded hole patterns. Cooling plate 512 may also include one or more mounting features, e.g., threaded holes, for sensor mounting. For example, one or more threaded holes 534 may be provided to allow thermocouples or other temperature sensors to be installed on the backside face of cooling plate 512 within first thermal contact patch 514. Due to the relatively low thermal resistance present in the middle of first thermal contact patch 514, threaded hole 534 may present an ideal location to obtain temperature measurements that are not only representative of the temperature of cooling plate 512, but also of substrate support 506 immediately above the sensor. The use of high-temperature coolant allows for enhanced temperature management capabilities, as outlined in the scenarios described below.

First, consider a scenario in which chuck 200 is equipped with a heater that is capable of delivering a maximum of 1 kW of heat power to wafer support 210. Chuck 200 is required to be able to allow a wafer supported by wafer support 210 to be heated to a process temperature of 220° C. while coolant kept at a nominal 20° C. is circulated through high-temperature cooling passage 245 (in this case, the coolant used is not operated at a high-temperature, and would be more akin to a low-temperature coolant). The heat delivered to wafer support 210 will, in a vacuum, continue to accumulate within wafer support 210, subject to any radiative heat loss into the environment and conductive heat loss through the structures that support wafer support 210, e.g., cooling plate 225 and high-temperature cooling passage 245. Due to the need to shed additional heat that may be imparted to wafer support 210 by the processing environment, cooling plate 225 may be designed to be as thermally conductive as possible while still allowing for the heater to heat wafer support to the target process temperature. In this case, the maximum overall thermal conductivity permitted would be 50 W/° C. Since the temperature difference between the 220° C. process temperature and the 20° C. coolant temperature is $\Delta T=200°$ C., the maximum overall thermal conductivity supported would be 1 kW/200° C., i.e., 50 W/° C. This is a high-level example and does not, for example, account for factors such as the asymptotic nature of such calculations.

In such a scenario, after chuck 200 reaches the process temperature of 220° C., additional heat may be provided to wafer support 210 from the process environment, e.g., heat from generated plasmas. Such process heat may exceed the amount of heat provided by the heater. For example, a semiconductor process may impart 2 kW of heat energy to wafer support 210. While the heater may be turned off to attempt to maintain the desired process temperature, the process heat must be shed from wafer support 210 or wafer support 210 will rise beyond the desired process temperature. In this scenario, the maximum overall thermal conductivity was established at 50 W/° C., which allowed the heater to raise wafer support 210 to the process temperature. However, the thermal choking effect of such an overall thermal conductivity also means that a larger temperature difference will be required between the coolant and wafer support 210 to shed the process heat. For example, with 2 kW of heat, a temperature difference of 400° C. is required, which means that wafer support 210 would need to reach temperatures of 420° C.

In a similar scenario using high-temperature coolant, chuck 200 is equipped with a heater that is also capable of delivering a maximum of 1 kW of heat power to wafer support 210. However, instead of using coolant at 20° C., high-temperature coolant at 120° C. is used. The maximum allowable overall thermal conductivity that could be present in this scenario would be 10 W/° C. After processing begins and 2 kW of process heat is imparted to wafer support 210 and the heater is turned off, wafer support will still experience a temperature rise in order to shed the excess kW of heat. However, a temperature difference of only 200° C. between wafer support 210 and the high-temperature coolant at 120° C. is required in this scenario, i.e., wafer support 210 may only rise to 320° C.

During operation, the implementation shown in FIG. 2A may have two separate coolants circulated through high-temperature cooling passage 255 and housing cooling passage 245, respectively. Both radial thermal chokes and coolants may contribute to the overall thermal conductivity for chuck 200.

For example, high-temperature cooling passage 255 may have a high-temperature coolant such as Galden™ circulated through it, and housing cooling passage 245 may have a low-temperature housing coolant such as water circulated through it. The high-temperature coolant may be kept at a nominal 100-150° C., and the housing coolant may be kept at nominal room temperature, e.g., 20° C. The use of high-temperature coolant allows for support of higher wafer support 210 temperatures without generating undesirably large temperature gradients, which may cause thermal stresses damaging to components.

During the preheat process, some heat from the chuck heaters is transferred via first radial thermal choke 260 to the outer wall of housing 240. The heat transferred via first radial thermal choke 260 is substantially less than the heat transferred by second radial thermal choke 265 to the high-temperature coolant. For preheat conditions where heat flows from the high-temperature coolant to cooling plate 225 rather than vice versa, heat from the high-temperature coolant may also partially flow through radial thermal choke 260 and to the outer wall of housing 240. Due to thermal choke 260, however, the amount of heat that flows through radial thermal choke 260 towards the housing will be significantly less than the amount of heat imparted by high-temperature cooling passage 255, the heater elements, and any process-generated heat.

While wafer support 210 is at a lower temperature than the high-temperature coolant, heat will begin to flow from high-temperature cooling passage 255 into cooling plate 225 and through second radial thermal choke 265. Heat will then flow from second radial thermal choke 265 to wafer support 210 via thermal contact patch 230 and, to a much lesser extent, to housing 240 via first radial thermal choke 260.

After the temperature of wafer support 210 exceeds the temperature of the high-temperature coolant, e.g., 150° C., heat from the heater elements (as well as heat generated by any process environmental effects) will start flowing from wafer support 210 into high-temperature cooling passage 255. The heater elements may be turned off if their heat is not necessary to maintain process temperature. The rate of heat flow will increase as the temperature of 210 climbs relative to the temperature of the high-temperature coolant.

The temperature of the coolants may also be varied to allow for support of a larger temperature difference without substantially raising the temperature of wafer support 210. For example, if the high-temperature coolant is lowered from 120° C. to 100° C. after process heat is being imparted to wafer support 210 in the above high-temperature coolant scenario, wafer support 210's temperature would only need to rise to 300° C.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/ processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. Further, the disclosed methods may be implemented in a process with lithography and/or patterning processes preceding or following the disclosed methods.

In some implementations, the chuck may be installed in a reactor and linked to a system controller having instructions for controlling process operations. The system controller will typically include one or more memory devices and one or more processors configured to execute the instructions so that the apparatus will perform various semiconductor fabrication processes. Machine-readable media containing instructions for controlling process operations may be coupled to the system controller. The processors may include a CPU or computer and may include or be communicatively connected with one or more analog and/or digital input/output connections, stepper motor controller boards, etc. The system controller, for example, may be configured to control gas delivery to the showerhead, pedestal movement, vacuum port suction to evacuate gas from the reactor, power and frequency to the plasma electrodes, and/or heating and cooling elements, if present in a particular implementation.

Typically there will be a user interface associated with the system controller. The user interface may include a display screen, graphical software displays of the apparatus and/or process conditions, and user input devices such as pointing devices, keyboards, touch screens, microphones, etc. The system controller may be connected to any or all of the components shown in of a tool or module, including those shown in the Figures of this application; the system controller's placement and connectivity may vary based on the particular implementation.

In certain implementations, the system controller controls the pressure in the processing chambers. The system controller may also control the concentration of various process gases in the chamber by regulating valves, liquid delivery controllers, and MFCs in the delivery system as well as flow restriction valves in an exhaust line. The system controller executes system control software including sets of instructions for controlling the timing, flow rates of gases and liquids, chamber pressure, chamber/showerhead/pedestal/substrate temperature, and/or other parameters of a particular process. Other computer programs stored on memory devices associated with the controller may be employed in some implementations. In certain implementations, the system controller controls the transfer of a substrate into and out of the various apparatuses shown in the figures.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, process gas flow rates, RF power, as well as others described above. These parameters are provided to the user in the form of a recipe, and may be entered utilizing the user interface. Signals for monitoring the process may be provided by analog and/or digital input connections of the system controller. The signals for controlling the process are output on the analog and digital output connections of the apparatus.

Although several implementations of this invention have been described in detail herein with reference to the accompanying drawings, it is to be understood that the invention is not limited to these precise implementations, and that various changes and modifications may be effected therein by one skilled in the art without departing from the scope of spirit of the invention as defined in the appended claims.

We claim:

1. A wafer support assembly for use in semiconductor processing, the wafer support assembly comprising:
   a substrate support, wherein the substrate support is substantially cylindrical and has a nominal outer diameter D, a top side configured to support a semiconductor wafer, and a bottom side opposite the top side; and
   a cooling plate, wherein:
      the cooling plate is substantially radially symmetric,
      the cooling plate contacts the bottom side of the substrate support across a first thermal contact patch with a first area,
      the first thermal contact patch is substantially annular in shape, centered on the substrate support, and has a nominal inner diameter and a nominal outer diameter defining an average nominal diameter of between 50% to 70% of D,
      the cooling plate and the substrate support have substantially no contact with each other outside of the nominal outer diameter of the first thermal contact area,
      the cooling plate includes a first radial thermal choke in a region outside of the nominal outer diameter of the first thermal contact area,
      the cooling plate contacts the bottom side of the substrate support across a second thermal contact patch with a second area,
      the second thermal contact patch is substantially circular in overall exterior shape, is centered on the substrate support, and has a nominal outer diameter less than 20% of D, and
      the cooling plate includes a second radial thermal choke in a region between the nominal outer diameter of the second thermal contact patch and the nominal inner diameter of the first thermal contact patch.

2. The wafer support assembly of claim 1, wherein the substrate support and the cooling plate are bonded together across the second thermal contact patch and the cooling plate contacts the substrate support in the second thermal contact patch at least partially via the bond material.

3. The wafer support assembly of claim 1, wherein the substrate support and the cooling plate have a through-hole extending through the center of both the substrate support and the cooling plate.

4. The wafer support assembly of claim 2, wherein the substrate support and the cooling plate have substantially no contact with each other between the nominal inner diameter of the first thermal contact patch and the nominal outer diameter of the second thermal contact patch.

5. The wafer support assembly of claim 2, wherein the cooling plate has one or more feed-through holes between the nominal inner diameter of the first thermal contact patch and the nominal outer diameter of the second thermal contact patch, each feed-through hole aligned with a corresponding feature in the substrate support and each sized such that a component associated with the feed-through hole does not contact the cooling plate when installed in the wafer support assembly.

6. The wafer support assembly of claim 3, wherein:
   the cooling plate has one or more feed-through holes between the nominal inner diameter of the first thermal contact patch and the nominal outer diameter of the second thermal contact patch, each feed-through hole aligned with a corresponding feature in the substrate support and each sized such that a component associated with the feed-through hole does not contact the cooling plate when installed in the wafer support assembly, and
   the cooling plate includes a threaded hole pattern between the one or more feed-through holes and the through-hole, the threaded hole pattern configured to mount a gas feed line interface.

7. The wafer support assembly of claim 1, wherein the wafer support is made from a ceramic.

8. The wafer support assembly of claim 1, wherein the cooling plate is made from molybdenum.

9. The wafer support assembly of claim 1, wherein the wafer support includes one or more planar electrodes embedded within the wafer support.

10. The wafer support assembly of claim 1, wherein the wafer support further includes a heater element embedded within the substrate support.

11. The wafer support assembly of claim 1, further comprising:
    a pedestal base, wherein:
       the pedestal base has an annular overall shape and a raised annular rim having an inner rim diameter smaller than an outer diameter of the cooling plate, and
       the pedestal base has an inner region recessed from, and bounded by, the raised annular rim, the cooling plate in contact with the raised annular rim, and the inner region separated from the cooling plate by a gap, wherein:
          the cooling plate is mounted to the pedestal base via a mounting interface on the raised annular rim, and
          the cooling plate is substantially centered on the raised annular rim.

12. The wafer support assembly of claim 11, further comprising a cooling plate seal, wherein:
    the pedestal base, the cooling plate, or both the pedestal base and the cooling plate include features configured to receive the cooling plate seal, and
    the cooling plate seal hermetically seals the mounting interface.

13. The wafer support assembly of claim 11, wherein:
    the pedestal base includes one or more cooling passages in thermal contact with the pedestal base and configured to route cooling fluid flow across a distributed area of the pedestal base.

14. The wafer support assembly of claim 13, wherein the one or more cooling passages are located within the inner region.

15. The wafer support assembly of claim 11, wherein the pedestal base further includes an annular cavity outside of the inner region, the annular cavity containing one or more electromagnetic coils.

16. The wafer support assembly of claim 11, wherein the pedestal base is made from aluminum.

17. The wafer support assembly of claim 1, further comprising one or more lift-pin feed-through features, each lift-pin feed-through feature:
   centered on a reference circle with a diameter of between 90% and 100% of D,
   providing clear passage through the substrate support and the cooling plate in a direction substantially normal to the substrate support, and
   sized such that a lift-pin associated with the lift-pin feed-through does not contact the substrate support and the cooling plate when installed in the wafer support assembly.

18. The wafer support assembly of claim 17, wherein the lift-pin feed-through features comprise axial, open channels in an outermost surface of the substrate support and corresponding, non-open through-holes in the cooling plate.

19. The wafer support assembly of claim 1, wherein the cooling plate includes one or more retaining features configured to mount a high-temperature cooler to the cooling plate on a side of the cooling plate opposite the first thermal contact patch and within a region substantially coextensive with the first area.

20. The wafer support assembly of claim 1, wherein the first area represents more than 95% of the contact area between the substrate support and the cooling plate.

21. The wafer support assembly of claim 1, wherein the first area and the second area, in combination, represent more than 95% of the contact area between the substrate support and the cooling plate.

22. A wafer support assembly for use in semiconductor processing, the wafer support assembly comprising:
   a substrate support, wherein the substrate support is substantially cylindrical and has a nominal outer diameter D, a top side configured to support a semiconductor wafer, and a bottom side opposite the top side;
   a cooling plate; and
   a pedestal base, wherein:
      the cooling plate is substantially radially symmetric,
      the cooling plate contacts the bottom side of the substrate support across a first thermal contact patch with a first area,
      the first thermal contact patch is substantially annular in shape, centered on the substrate support, and has a nominal inner diameter and a nominal outer diameter defining an average nominal diameter of between 50% to 70% of D,
      the cooling plate and the substrate support have substantially no contact with each other outside of the nominal outer diameter of the first thermal contact area,
      the cooling plate includes a first radial thermal choke in a region outside of the nominal outer diameter of the first thermal contact area,
      the pedestal base has an annular overall shape and a raised annular rim having an inner rim diameter smaller than an outer diameter of the cooling plate,
      the pedestal base has an inner region recessed from, and bounded by, the raised annular rim, the cooling plate is in contact with the raised annular rim, and the inner region is separated from the cooling plate by a gap,
      the pedestal base includes one or more cooling passages in thermal contact with the pedestal base and configured to route cooling fluid flow across a distributed area of the pedestal base,
      the cooling plate is mounted to the pedestal base via a mounting interface on the raised annular rim, and
      the cooling plate is substantially centered on the raised annular rim.

23. The wafer support assembly of claim 22, wherein:
   the cooling plate also contacts the bottom side of the substrate support across a second thermal contact patch with a second area, the second thermal contact patch substantially circular in overall exterior shape, centered on the substrate support, and having a nominal outer diameter less than 20% of D;
   the cooling plate further includes a second radial thermal choke in a region between the nominal outer diameter of the second thermal contact patch and the nominal inner diameter of the first thermal contact patch; and
   the substrate support and the cooling plate are bonded together across the second thermal contact patch and the cooling plate contacts the substrate support in the second thermal contact patch at least partially via the bond material.

24. The wafer support assembly of claim 22, wherein:
   the cooling plate also contacts the bottom side of the substrate support across a second thermal contact patch with a second area, the second thermal contact patch substantially circular in overall exterior shape, centered on the substrate support, and having a nominal outer diameter less than 20% of D;
   the cooling plate further includes a second radial thermal choke in a region between the nominal outer diameter of the second thermal contact patch and the nominal inner diameter of the first thermal contact patch; and
   the substrate support and the cooling plate have substantially no contact with each other between the nominal inner diameter of the first thermal contact patch and the nominal outer diameter of the second thermal contact patch.

25. The wafer support assembly of claim 22, wherein the cooling plate is made from molybdenum.

26. The wafer support assembly of claim 22, wherein the one or more cooling passages are located within the inner region.

27. The wafer support assembly of claim 22, wherein the pedestal base further includes an annular cavity outside of the inner region, the annular cavity containing one or more electromagnetic coils.

28. The wafer support assembly of claim 22, wherein the pedestal base is made from aluminum.

29. The wafer support assembly of claim 22, wherein the first area represents more than 95% of the contact area between the substrate support and the cooling plate.

30. The wafer support assembly of claim 22, wherein:
   the cooling plate also contacts the bottom side of the substrate support across a second thermal contact patch with a second area, the second thermal contact patch substantially circular in overall exterior shape, centered on the substrate support, and having a nominal outer diameter less than 20% of D;
   the cooling plate further includes a second radial thermal choke in a region between the nominal outer diameter of the second thermal contact patch and the nominal inner diameter of the first thermal contact patch; and the first area and the second area, in combination, represent more than 95% of the contact area between the substrate support and the cooling plate.

31. A wafer support assembly for use in semiconductor processing, the wafer support assembly comprising:
a substrate support, wherein the substrate support is substantially cylindrical and has a nominal outer diameter D, a top side configured to support a semiconductor wafer, and a bottom side opposite the top side;
a cooling plate; and
a pedestal base, wherein:
the cooling plate is substantially radially symmetric,
the cooling plate contacts the bottom side of the substrate support across a first thermal contact patch with a first area,
the first thermal contact patch is substantially annular in shape, centered on the substrate support, and has a nominal inner diameter and a nominal outer diameter defining an average nominal diameter of between 50% to 70% of D,
the cooling plate and the substrate support have substantially no contact with each other outside of the nominal outer diameter of the first thermal contact area,
the cooling plate includes a first radial thermal choke in a region outside of the nominal outer diameter of the first thermal contact area,
the pedestal base has an annular overall shape and a raised annular rim having an inner rim diameter smaller than an outer diameter of the cooling plate,
the pedestal base has an inner region recessed from, and bounded by, the raised annular rim, the cooling plate in contact with the raised annular rim, and the inner region separated from the cooling plate by a gap,
the pedestal base includes an annular cavity outside of the inner region, the annular cavity containing one or more electromagnetic coils,
the cooling plate is mounted to the pedestal base via a mounting interface on the raised annular rim, and
the cooling plate is substantially centered on the raised annular rim.

32. The wafer support assembly of claim 31, wherein:
the cooling plate also contacts the bottom side of the substrate support across a second thermal contact patch with a second area, the second thermal contact patch substantially circular in overall exterior shape, centered on the substrate support, and having a nominal outer diameter less than 20% of D;
the cooling plate further includes a second radial thermal choke in a region between the nominal outer diameter of the second thermal contact patch and the nominal inner diameter of the first thermal contact patch; and
the substrate support and the cooling plate are bonded together across the second thermal contact patch and the cooling plate contacts the substrate support in the second thermal contact patch at least partially via the bond material.

33. The wafer support assembly of claim 31, wherein:
the cooling plate also contacts the bottom side of the substrate support across a second thermal contact patch with a second area, the second thermal contact patch substantially circular in overall exterior shape, centered on the substrate support, and having a nominal outer diameter less than 20% of D;
the cooling plate further includes a second radial thermal choke in a region between the nominal outer diameter of the second thermal contact patch and the nominal inner diameter of the first thermal contact patch; and
the substrate support and the cooling plate have substantially no contact with each other between the nominal inner diameter of the first thermal contact patch and the nominal outer diameter of the second thermal contact patch.

34. The wafer support assembly of claim 31, wherein:
the cooling plate also contacts the bottom side of the substrate support across a second thermal contact patch with a second area, the second thermal contact patch substantially circular in overall exterior shape, centered on the substrate support, and having a nominal outer diameter less than 20% of D;
the cooling plate further includes a second radial thermal choke in a region between the nominal outer diameter of the second thermal contact patch and the nominal inner diameter of the first thermal contact patch; and
the first area and the second area, in combination, represent more than 95% of the contact area between the substrate support and the cooling plate.

35. The wafer support assembly of claim 31, wherein the cooling plate is made from molybdenum.

36. The wafer support assembly of claim 31, wherein:
the pedestal base includes one or more cooling passages in thermal contact with the pedestal base and configured to route cooling fluid flow across a distributed area of the pedestal base, and the one or more cooling passages are located within the inner region.

37. The wafer support assembly of claim 31, wherein the pedestal base is made from aluminum.

38. The wafer support assembly of claim 31, wherein the first area represents more than 95% of the contact area between the substrate support and the cooling plate.

* * * * *